(12) United States Patent
Conry et al.

(10) Patent No.: US 10,171,076 B2
(45) Date of Patent: *Jan. 1, 2019

(54) INDEPENDENT CONTROL OF BRANCH FETS FOR RF PERFORMANCE IMPROVEMENT

(71) Applicant: pSemi Corporation, San Diego, CA (US)

(72) Inventors: Michael Conry, San Diego, CA (US); Kevin Roberts, Rohnert Park, CA (US); Edward Nicholas Comfoltey, San Diego, CA (US)

(73) Assignee: pSemi Corporation, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/618,584

(22) Filed: Jun. 9, 2017

(65) Prior Publication Data

US 2017/0346486 A1    Nov. 30, 2017

Related U.S. Application Data

(63) Continuation of application No. 15/066,464, filed on Mar. 10, 2016, now Pat. No. 9,712,160, which is a continuation of application No. 14/103,401, filed on Dec. 11, 2013, now Pat. No. 9,306,617.

(51) Int. Cl.
*H03K 17/693* (2006.01)
*H04B 1/48* (2006.01)
*H04B 1/44* (2006.01)

(52) U.S. Cl.
CPC ............ *H03K 17/693* (2013.01); *H04B 1/44* (2013.01); *H04B 1/48* (2013.01); *H04B 2001/485* (2013.01)

(58) Field of Classification Search
CPC ........ H04B 1/18; H04B 1/0817; H04B 1/082; H04B 1/0825
USPC .............................. 455/78–83, 277.1, 552.1
See application file for complete search history.

(56) References Cited

U.S. PATENT DOCUMENTS

| 9,306,617 | B2 * | 4/2016 | Conry | H04B 1/44 |
| 9,712,160 | B2 | 7/2017 | Conry et al. | |
| 2010/0060534 | A1 * | 3/2010 | Oodachi | H01Q 3/30 343/745 |
| 2016/0191054 | A1 | 6/2016 | Conry et al. | |

OTHER PUBLICATIONS

Nguyen, Lee, Office Action received from the USPTO dated Dec. 6, 2016 for U.S. Appl. No. 15/066,464, 9 pgs.

(Continued)

*Primary Examiner* — Lee Nguyen
(74) *Attorney, Agent, or Firm* — Jaquez Land Greenhaus LLP; Martin J. Jaquez, Esq.; John Land, Esq.

(57) ABSTRACT

A FET-based RF switch architecture and method that provides for independent control of FETs within component branches of a switching circuit. With independent control of branch FETs, every RF FET in an inactive branch that is in an "open" (capacitive) state can be shunted to RF ground and thus mitigate impedance mismatch effects. Providing a sufficiently low impedance to RF ground diminishes such negative effects and reduces the sensitivity of the switch circuit to non-matched impedances.

18 Claims, 6 Drawing Sheets

(56) References Cited

OTHER PUBLICATIONS

Nguyen, Lee, Notice of Allowance received from the USPTO dated Apr. 19, 2017 for U.S. Appl. No. 15/066,464, 5 pgs.
Conry, et al., Response filed in the USPTO dated Feb. 10, 2017 for U.S. Appl. No. 15/066,464, 17 pgs.

* cited by examiner

FIG. 6
Shunted

FIG. 7A
Non-Shunted Inactive

FIG. 7B
Non-Shunted Active

INDEPENDENT CONTROL OF BRANCH FETS FOR RF PERFORMANCE IMPROVEMENT

CROSS REFERENCE TO RELATED APPLICATIONS

Claims of Priority

This application is a continuation of U.S. application Ser. No. 15/066,464 filed Mar. 10, 2016 entitled "Independent Control of Branch FETs for RF Performance Improvement", the disclosure of which is incorporated herein by reference in its entirety. Application Ser. No. 15/066,464 is a continuation of U.S. application Ser. No. 14/103,401 filed Dec. 11, 2013, entitled "Independent Control of Branch FETs for RF Performance Improvement" (now U.S. Pat. No. 9,306,617 issued Apr. 5, 2016), the disclosure of which is incorporated herein by reference in its entirety.

BACKGROUND

(1) Technical Field

This invention generally relates to electronic circuits, and more specifically to radio frequency (RF) switch circuits utilizing field effect transistors (FETs).

(2) Background

A recent trend in cellular radio architectures has been to incorporate a multiple pole FET-based RF switch architecture to accommodate multiple antennae, such that transmit and receive paths can connect to any selected antenna. This added flexibility has led to more complicated configurations of series and shunt RF FETs, requiring the need for novel topological innovations to overcome performance degradations in multiple pole FET switches. For example, in an RF switch architecture, when RF FETs are turned off and have high impedance paths to RF ground, certain impedance mismatch conditions can degrade signal insertion loss performance.

Figure 1:
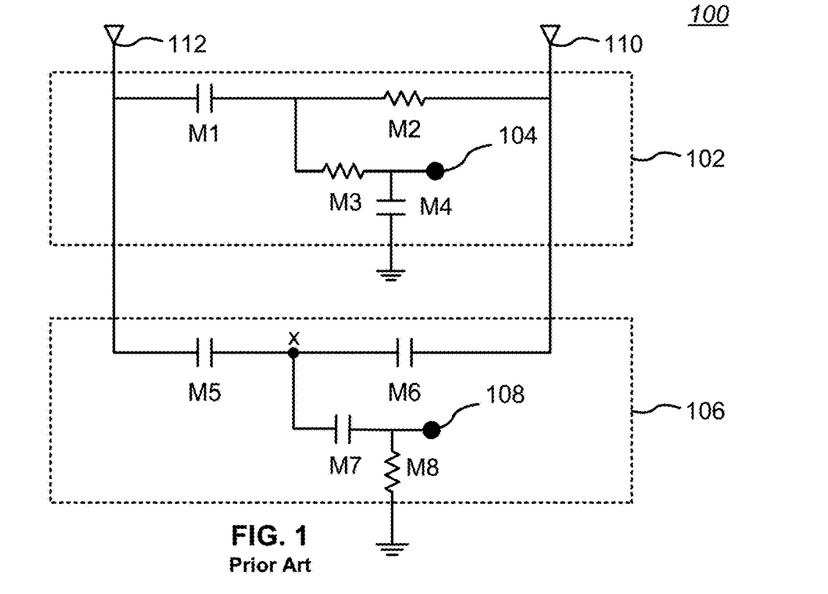
FIG. 1 is an equivalent-element schematic diagram of a typical prior art FET-based RF switch circuit having two branches.

As an example, FIG. 1 is an equivalent-element schematic diagram of a typical prior art FET-based RF switch circuit 100 having two branches. Elements M1-M8 are implemented as FET switches. With respect to applied RF signals, each FET switch when "off" or "open" behaves as a capacitor, and when "on" or "closed" behaves as a conductive resistor. In the configuration shown, FET switches M1-M4 comprise a first branch 102 (for a port 104), and FET switches M5-M8 comprise a second branch 106 (for port 108). Either of the ports 104 or 108 may be coupled to antennas 110, 112 to conduct transmitted or received RF signals to connected circuitry (not shown).

In the configuration shown in FIG. 1, branch 102 is active, and port 104 is coupled to antenna 110 through FET switches M2 and M3, and isolated by FET switch M1 from antenna 112. However, if M1 is "closed" and M2 is "open", then port 104 is coupled to antenna 112 through M1 and M3, and isolated by FET switch M2 from antenna 110. In both cases, branch 106 is inactive and FET switches M5 and M6 are open, nominally isolating port 108 from both antennas 110, 112. To couple port 108 to antenna 110, FET switches M1-M4 are set to the states shown in FIG. 1 for FET switches M5-M8, and FET switches M5-M8 are set to the states shown for FET switches M1-M4. Note also that when a port is coupled to an antenna, the other antenna may be connected to a different port or be left "floating" (as in the example shown in FIG. 1). Not shown are the control lines that synchronize state changes of the FET switches M1-M8, as described above. Of note is the fact that FET switches M7 and M8 are synchronously controlled to be in complementary states, so that FET switch M7 is always "open" when FET switch M8 is "closed, and vice versa.

A problem arises because the switch circuit 100 of FIG. 1 has a capacitive connection between the antennas 110, 112. In particular, for the configuration shown in FIG. 1, there is a high impedance path from node X to ground through FET switches M7 and M8, since FET switches M5, M6, and M7 form a capacitor divider. In the illustrated state, this causes FET switches M5 and M6 to have a high impedance to RF ground when in the "open" (capacitive) state and increases the performance sensitivity to load mismatch on antenna 112.

Figure 2:
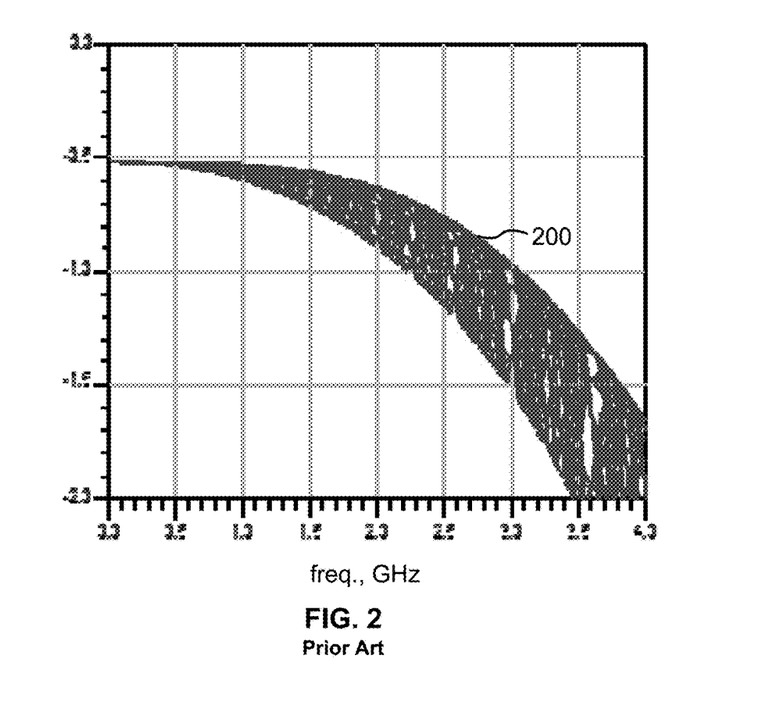
FIG. 2 shows the insertion loss of a signal path to one antenna (in dB) versus frequency for a 3:1 VSWR load on the unused antenna, swept across multiple phases, for a test implementation of the prior art switch circuit shown in FIG. 1.

FIG. 2 shows the insertion loss 200 of a signal path to one antenna (in dB) versus frequency for a 3:1 VSWR load on the unused antenna, swept across multiple phases, for a test implementation of the prior art switch circuit 100 shown in FIG. 1. For the particular test implementation of the switch circuit 100, the envelope of the insertion loss 200 showed a variability of up to 0.5 dB in the frequency range of interest (i.e., 0 GHz to 3 GHz in the illustrated example).

Accordingly, there is a need for a circuit and method for improving RF performance of FET-based circuits used in RF switch architectures. The present invention addresses this need.

SUMMARY OF THE INVENTION

The present invention includes a FET-based RF switch architecture and method that provides for independent control of FETs within component branches of a switching circuit. With independent control of FETs in a branch, every RF FET in an inactive branch that is in an "open" (capacitive) state can be shunted to RF ground and thus mitigate the impedance mismatch effects of prior art architectures. Accordingly, providing a sufficiently low impedance to RF ground diminishes such negative effects and reduces the sensitivity of the switch circuit to non-matched impedances.

In each branch of such a switch, a programmable shunt element is provided that selectively couples the capacitive elements of the branch to ground when the branch is inactive (i.e., while another branch is actively coupling a signal to a destination element). In some embodiments, the inactive branches may be operated as a conventional circuit when impedance matching is not a problem for particular applications.

The concept of independent control of programmable shunt FETs can be extended to the other FET switches of the branches. That is, rather than controlling the FET switches to change state in a rigidly synchronous fashion, all of the FET switches can be independently controlled, allowing unusual configurations of switch states that may have use in particular applications. Accordingly, the invention is not limited to programmable control of only the shunt FET switches.

The inventive concepts also can be applied to a switching configuration that comprises a single "branch". For example, a node or port can be selectively coupled to two or more antennas, or completely disconnected from any of the antennas, by opening or closing corresponding gateway switches programmatically. In addition, the node or port can be coupled to circuit ground as desired by closing a shunt switch programmatically, thus improving the isolation of the antennas from circuitry coupled to the node or port through the gateway switches.

The details of one or more embodiments of the invention are set forth in the accompanying drawings and the description below. Other features, objects, and advantages of the invention will be apparent from the description and drawings, and from the claims.

DESCRIPTION OF THE DRAWINGS

Like reference numbers and designations in the various drawings indicate like elements.

DETAILED DESCRIPTION OF THE INVENTION

The present invention includes a FET-based RF switch architecture and method that provides for independent control of FETs within component branches of a switching circuit. With independent control of branch FETs, every RF FET in an inactive branch that is in an "open" (capacitive) state can be shunted to RF ground and thus mitigate the impedance mismatch effects of prior art architectures. Accordingly, providing a sufficiently low impedance to RF ground diminishes such negative effects and reduces the sensitivity of the switch circuit to non-matched impedances.

Figure 3:
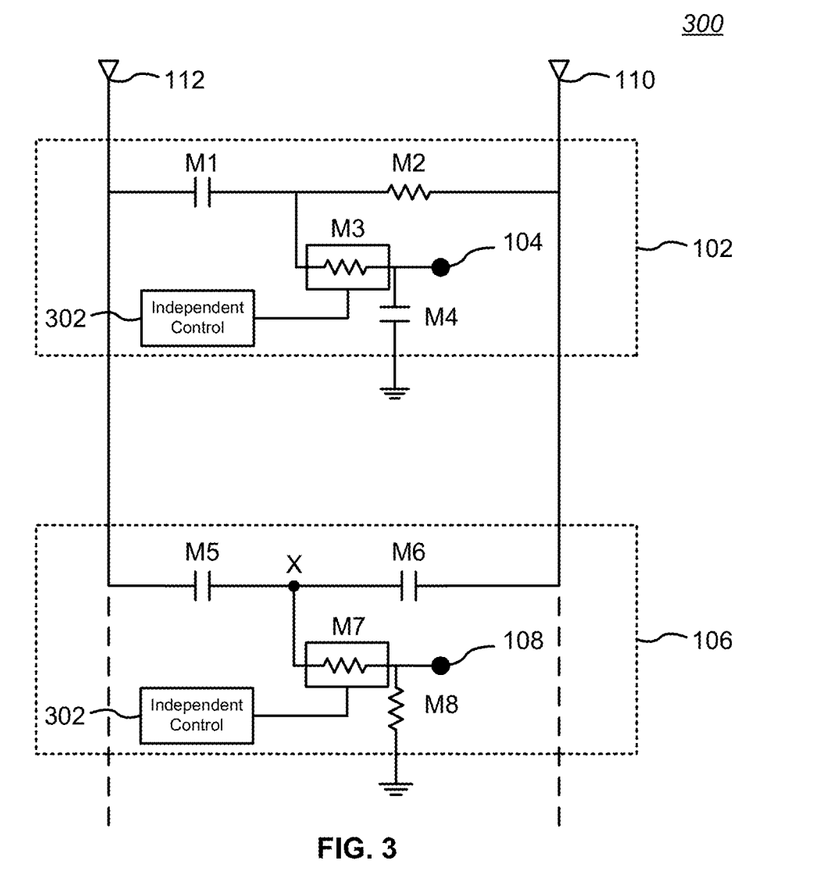
FIG. 3 is an equivalent-element schematic diagram of a FET-based RF switch embodiment in accordance with the present invention.

FIG. 3 is an equivalent-element schematic diagram of a FET-based RF switch circuit 300 embodiment in accordance with the present invention. Elements M1-M8 are implemented as FET switches. With respect to applied RF signals, each FET switch when "off" or "open" behaves as a capacitor, and when "on" or "closed" behaves as a conductive resistor. In the configuration shown, FET switches M1-M4 comprise a first branch 102 (for a port 104), and FET switches M5-M8 comprise a second branch 106 (for port 108). Either of the ports 104 or 108 may be coupled to antennas 110, 112 to conduct transmitted or received RF signals to connected circuitry (not shown).

In the configuration shown in FIG. 3, branch 102 is active, and port 104 is coupled to antenna 110 through FET switches M2 and M3, and isolated by FET switch M1 from antenna 112. However, if M1 is "closed" and M2 is "open", then port 104 is coupled to antenna 112 through M1 and M3, and isolated by FET switch M2 from antenna 110. Accordingly, FET switches M1 and M2 behave as "gateway" switches to select a desired signal path to the antennas 110, 112 for port 104.

Similar to branch 102, FET switches M5 and M6 in branch 106 behave as "gateway" switches to select a desired signal path to the antennas 110, 112 for port 108. When branch 102 of the switch circuit 300 is active, branch 106 is normally inactive; accordingly, gateway FET switches M5 and M6 are open, nominally isolating port 108 from both antennas 110, 112. Further, FET switch M8 is closed, behaving as a shunt and coupling port 108 to circuit ground. However, in contrast to the prior art, FET switch M7 of inactive branch 106 is not uniformly set to an "open" (capacitive) state when branch 102 of the switch circuit 300 is active. Instead, FET switch M7 is independently selectively settable (i.e., programmable) to be in a "closed" (resistive) shunt state or in an "open" (capacitive) state. While control lines (not shown in general) are coupled to all of the FET switches M1-M8 to effectuate state changes, the independent ability to control FET switch M7 (and counterpart programmable shunt FET switches in other branches) is emphasized by showing the presence of an independent control element 302.

When branch 102 of the switch circuit 300 is active and programmable shunt FET switch M7 in inactive branch 106 is in a "closed" shunt state, node X is shunted to ground through FET switches M7 and M8. This allows FET switches M5 and M6 to be connected to RF ground when in the "open" (capacitive) state. For added flexibility, since FET switch M7 is independently controllable, when FET switch M7 is in an "open" state, the switch circuit 300 behaves like existing designs.

When branch 106 of the switch circuit 300 is active to couple port 108 to one of the antennas 110, 112, the FET switches of branch 102 are operated in a reciprocal manner.

Note also that when a port is coupled to an antenna, the other antenna may be connected to a different port or be left "floating" (as in the example shown in FIG. 3). As should be clear, additional switching branches may be added to provide additional switching capability, as indicated by the dashed lines in FIG. 3. Further, additional ports can be added to each branch in known fashion.

By configuring the RF switch circuit 300 into independent, isolated branches and having finer control over state changes of the programmable shunt FETs of each branch through the independent control elements 302, the gateway FET switches M1/M2 and M5/M6 shown in FIG. 3 can be selectively shunted to RF ground. Doing so improves isolation of the antennas 102, 104 through the gateway FET switches of inactive branches.

Figure 4:
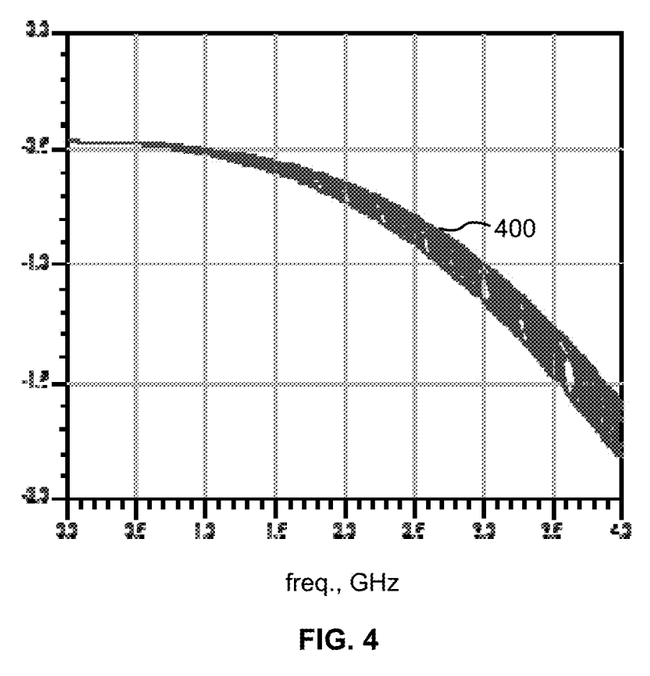
FIG. 4 shows the insertion loss of a signal path to one antenna (in dB) versus frequency for a 3:1 VSWR load on the unused antenna, swept across multiple phases, for a test implementation of the switch circuit shown in FIG. 3, with FET switches M5 and M6 shunted to ground through FET switches M7 and M8.

FIG. 4 shows the insertion loss 400 of a signal path to one antenna (in dB) versus frequency for a 3:1 VSWR load on the unused antenna, swept across multiple phases, for a test implementation of the switch circuit 300 shown in FIG. 3, with gateway FET switches M5 and M6 shunted to ground through shunt FET switches M7 and M8. For the particular test implementation of the switch circuit 300, the envelope of the insertion loss 400 showed a variability of around 0.2 dB in the frequency range of interest (i.e., 0 GHz to 3 GHz in the illustrated example), significantly reducing the insertion loss sensitivity to various confounding conditions and improving overall insertion loss performance in comparison to the variability of up to 0.5 dB for the prior art described above.

Figure 5:
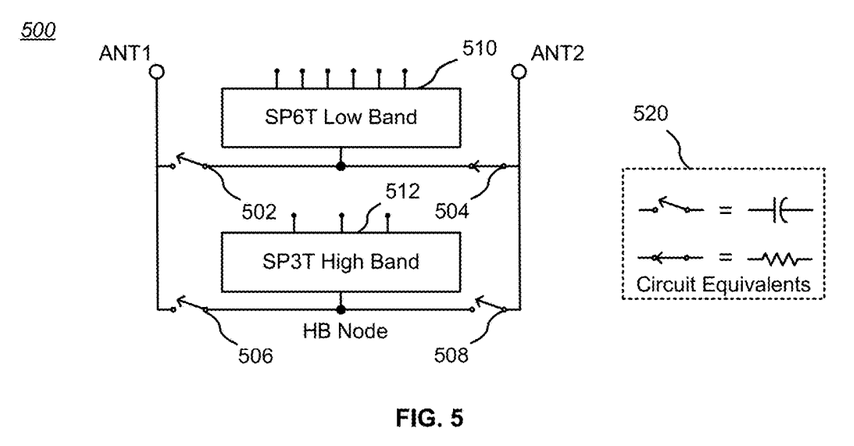
FIG. 5 is a circuit diagram showing a second embodiment of the invention.

FIG. 5 is a circuit diagram showing a second embodiment of the invention. In this embodiment, a switch circuit 500 includes a pair of antennas ANT1, ANT2 that may be selectively coupled through multiple ports to other circuitry (not shown) through gateway switches 502, 504, 506, 508 to single-pole, multiple throw switches (SPxT) 510, 512. In this example, one SPxT switch 510 is for a low band of frequencies and is shown as an SP6T switch; the other SPxT switch 512 is for a high band of frequencies and is shown as an SP3T switch. In each branch of the switch circuit 500, the combination of the coupled gateway switches and an associated SPxT switch provides for a double-pole, multiple throw switch architecture. The architecture can be extended to additional poles for additional antennas, additional branches for additional ports, and each of the SPxT switches may have more or fewer ports than shown.

Sub-diagram 520 in FIG. 5 shows the passive circuit equivalents to the open and closed states of the FET switches shown in the various figures. As in FIG. 3, the switching elements may be implemented as FET switches.

Figure 6:
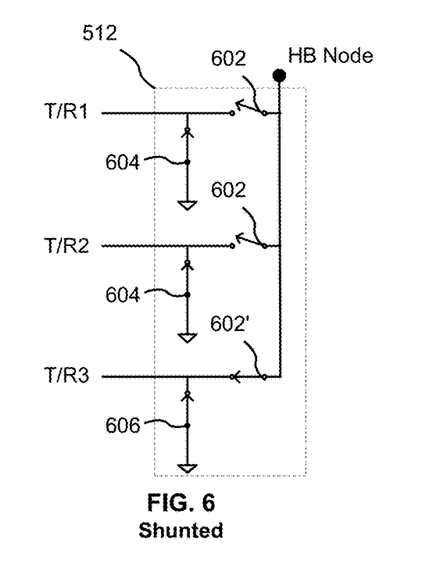
FIG. 6 is a circuit diagram of the high-band SP3T switch shown in FIG. 5, in a shunted state.

FIG. 6 is a circuit diagram of the high-band SP3T switch 512 shown in FIG. 5, in a shunted state. Only three ports are shown for simplicity, and fewer or more ports may be used for particular applications. In this embodiment, any of the transmit/receive ports T/R1-T/R3 may be coupled to the HB Node (corresponding to the same high band, or HB, node in FIG. 5) by closing an associated series switch 602, 602' and opening an associated shunt switch 604. Conversely, any of the transmit/receive ports T/R1-T/R3 may be uncoupled from the HB Node by opening its associated series switch 602, 602' and closing its associated shunt switch 604, 606 (which is the state shown for transmit/receive ports T/R1, T/R2, and T/R3 in FIG. 6).

When a branch of the switch circuit 500 is inactive, then the SPxT switch elements in that branch should be decoupled by opening all of the signal paths. However, as noted above, doing so with conventional architectures will make the "open" branches of the switch circuit 500 behave as capacitive dividers. Applying the teachings of the present invention to the circuit shown in FIG. 6, the HB Node is connected to ground by closing FET switches 602' and 606 in tandem. Doing so makes the combination of the switch 512 and its associated gateway switches 506, 508 behave like the M5-M8 branch shown in FIG. 3. Thus, in contrast to the prior art, FET switch 602' is not opened (making it behave like a capacitor), but instead independently closed (making it behave like a resistor) to match the state of FET switch 606, thus making the pair of FET switches 602', 606 behave as a shunt from the HB node to ground.

Figure 7A:
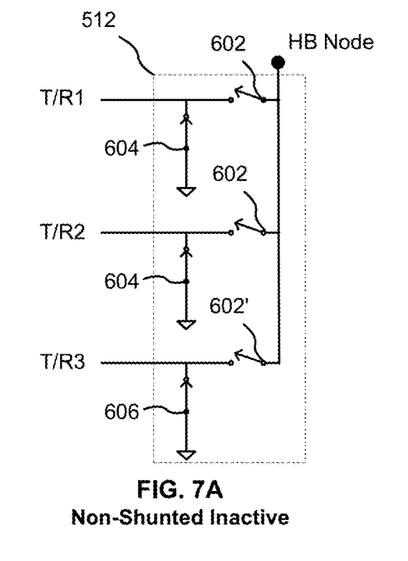
FIG. 7A is a circuit diagram of the high-band SP3T switch shown in FIG. 5, in a non-shunted inactive state.
Figure 7B:
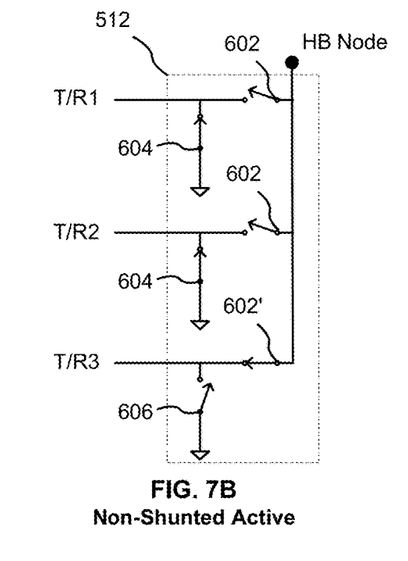
FIG. 7B is a circuit diagram of the high-band SP3T switch shown in FIG. 5, in a non-shunted active state.

The invention provides additional flexibility by allowing embodiments to also behave in a conventional manner. For example, FIG. 7A is a circuit diagram of the high-band SP3T switch 512 shown in FIG. 5, in a non-shunted inactive state. This circuit in general behaves like the circuit of FIG. 6, except that FET switches 602' and 606 are programmed to be oppositely switched, such that one is open while the other is closed, as in conventional designs. In the illustrated state, FET switch 606 is closed and FET switch 602' is open, thereby decoupling the associated T/R3 signal port from the HB Node. The opposite state is shown in FIG. 7B, which is a circuit diagram of the high-band SP3T switch shown in FIG. 5 in a non-shunted active state. In this configuration, FET switch 606 is open, and FET switch 602' is closed, thereby coupling the associated T/R3 signal port to the HB Node.

As should be clear, a single integrated circuit embodiment of the architecture shown in FIG. 5 may selectively program the switches 510, 512 to be in a non-shunted configuration (behaving like conventional switches) or to be in a shunted configuration (behaving in accordance with the present invention) simply by controlling the state of the shunt FET switch (switch 602' in the embodiments illustrated in FIG. 6 and FIG. 7).

Extensions of the Inventive Concepts

The concept of independent control of the programmable shunt FETs (e.g., M3 and M7 in FIG. 3) can be extended to the other FET switches of the branches. That is, rather than controlling the FET switches to change state in a rigidly synchronous fashion, all of the FET switches can be independently controlled, allowing unusual configurations of switch states that may have use in particular applications. Accordingly, the invention is not limited to programmable control of only the shunt FET switches corresponding to M3 and M7 in FIG. 2, but to all of the FETs of a branch.

Further, the independent control elements 302 shown in FIG. 3 can control the state of an associated programmable shunt FET switch to be other than in binary "open" or "closed" states. Thus, in a particular application, it may be useful to vary the impedance of the associated programmable shunt FET switch to be something between the impedance presented by fully "open" (capacitive) or fully "closed" (conductive) states.

Figure 8A:
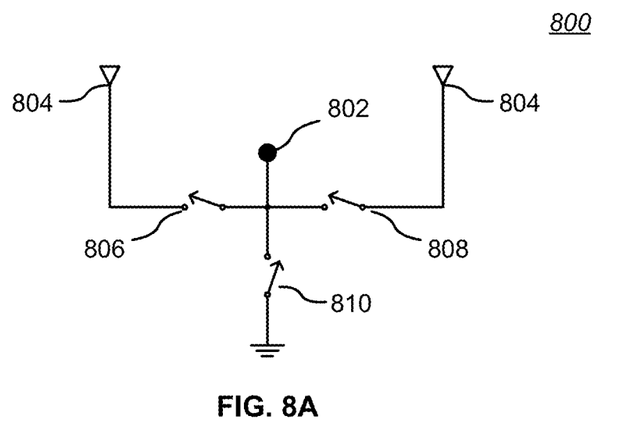
FIG. 8A is a schematic diagram of a switching circuit having a single branch configuration, depicting the various switch elements as schematic switches.
Figure 8B:
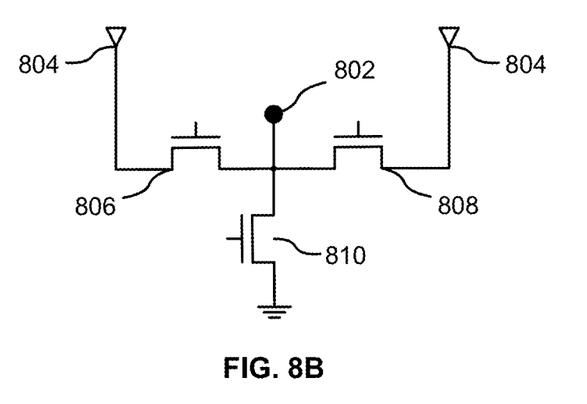
FIG. 8*b* is a circuit diagram of the single branch switching circuit of FIG. 8A, depicting the various switch elements as transistors.

The inventive concepts can be applied to a switching configuration that comprises a single "branch". For example, FIG. 8A is a schematic diagram of a switching circuit 800 having a single branch configuration, depicting the various switch elements as schematic switches; FIG. 8b is a circuit diagram of the single branch switching circuit of FIG. 8A, depicting the various switch elements as transistors. A node or port 802 can be selectively coupled to two or more external (with respect to the switching circuit 800) circuit elements 804, or completely disconnected from any of the circuit elements 804, by opening or closing corresponding gateway switches 806, 808 programmatically. The circuit elements 804 are shown as antennas in the illustrated embodiment by way of example only, and only two antennas are shown for simplicity. In addition, the node or port 802 can be coupled to circuit ground as desired by closing a shunt switch 810 programmatically, thus improving the isolation of the circuit elements 804 from circuitry coupled to the node or port 802 through the gateway switches 806, 808.

Implementation Details

As should be readily apparent to one of ordinary skill in the art, the invention can be implemented to meet a wide variety of possible specifications. Thus, selection of suitable component values are a matter of design choice. The switching and passive elements may be implemented in any suitable IC FET technology, including but not limited to MOSFET and IGFET structures. Integrated circuit embodiments may be fabricated using any suitable substrates and processes, including but not limited to standard bulk silicon, silicon-on-insulator (SOI), and silicon-on-sapphire (SOS) processes.

Other variations of the invention may include additional circuit elements. For example, low-pass, high-pass, and/or notch filters, or various transmission line, resistive, capacitive, or inductive circuit elements (passive or active) may be combined with the switch architecture of the present invention. As another example, any single FET switch may be implemented instead as a stack of series connected FETs to provide improved resistance to electro-static discharge (ESD) events.

Method Embodiments

Another aspect of the invention includes a method for operating a switch circuit, including the steps of:

STEP 1: providing a FET-based switch circuit including at least one switching branch, each switching branch including at least two programmable gateway switches configured to be connected to external circuit elements, a common node coupled to the at least two programmable gateway switches, and a shunt switch connected to the node; and STEP 2: programmatically shunting the node of at least one switching branch to circuit ground in order to selectively isolate such node with respect to any external circuit elements connected to the programmable gateway switches of such switching branch;

Yet another aspect of the invention includes a method for operating a multiple-branch switch circuit, including the steps of:

STEP 1: providing a FET-based switch circuit including at least two switching branches; and STEP 2: providing in each switching branch of the switch circuit a shunt element for selectively isolating such switching branch when at least one other switching branch is actively conducting an applied signal.

Still another aspect of the invention includes a method for switching a circuit including at least two independent switching branches, including the steps of:

STEP 1: providing in each switching branch at least two series connected gateway switches, the gateway switches defining selectable signal paths;

STEP 2: providing in each switching branch at least one signal switching circuit coupled to a common node for the gateway switches for selectively coupling at least one associated applied signal to a selected signal path through the node when such switching branch is active, and for coupling the node to circuit ground when such switching branch is inactive.

A number of embodiments of the invention have been described. It is to be understood that various modifications may be made without departing from the spirit and scope of the invention. For example, some of the steps described above may be order independent, and thus can be performed in an order different from that described. It is to be understood that the foregoing description is intended to illustrate and not to limit the scope of the invention, which is defined by the scope of the following claims, and that other embodiments are within the scope of the claims.

What is claimed is:

1. A switch circuit including:
   (a) at least two switching branches, each switching branch including:
      (1) at least two gateway switches configured to be connected to respective external circuit elements;
      (2) a common node coupled to the at least two gateway switches; and
      (3) a shunt circuit connected to the common node and programmatically settable to selectively isolate such switching branch independently of any other switching branch.

2. The invention of claim 1, wherein the shunt circuit of at least one switching branch is selectively configured to not isolate such switching branch when such switching branch is inactive.

3. The invention of claim 1, wherein the shunt circuit of a first switching branch includes a corresponding first signal port, and the shunt circuit of a second switching branch includes a corresponding second signal port, and wherein in at least one mode of operation, the shunt circuit of the first switching branch is programmatically set to couple the first signal port to a first external circuit element through one of the at least two gateway switches of the first switching branch, while the shunt circuit of the second switching branch is programmatically set to concurrently couple the second signal port to a second external circuit element through one of the at least two gateway switches of the second switching branch.

4. A switching circuit including:
   (a) a plurality of gateway switches each configured to be connected to respective external circuit elements;
   (b) at least one common node, each coupled to at least some of the plurality of gateway switches;
   (c) a plurality of signal ports; and
   (d) a plurality of shunt circuits, each connected between at least one common node and a corresponding one of the plurality of signal ports, and each programmatically settable to selectively isolate such corresponding signal port independently of any other signal port.

5. A switchable branch circuit including:
   (a) at least two gateway switches configured to be connected to respective external circuit elements;
   (b) a common port node connected to the at least two gateway switches; and
   (c) a shunt circuit connected to the common port node; wherein, within the switchable branch circuit:
      (1) in an inactive mode, the shunt circuit is programmatically set to a closed state and the at least two gateway switches are programmatically set to an open state so as to isolate the common port node from the external circuit elements and to shunt the common port node to circuit ground in order to isolate the common port node with respect to any external circuit elements connected to the gateway switches, and
      (2) in an active mode, the shunt circuit is programmatically set to an open state and at least one gateway switch is programmatically set to a closed state so as to enable coupling of the common port node through such at least one closed state gateway switch to the respective external circuit elements connected to such at least one closed state gateway switch.

6. The invention of claim 1, 4, or 5, wherein at least one switch includes a stack of series connected FETs.

7. The invention of claim 1, 4, or 5, wherein the circuit is fabricated as an integrated circuit using a silicon-on-insulator fabrication process.

8. The invention of claim 1, 4, or 5, wherein at least one switch includes a variable impedance FET programmatically settable to an impedance between the impedance presented by the FET when in a fully open state or when in a fully closed state.

9. The invention of claim 1, 4, or 5, wherein at least one external circuit element includes an antenna.

10. A method for operating a switch circuit including at least two switching branches, including:

(a) configuring each switching branch with at least two gateway switches to be connected to respective external circuit elements;
(b) configuring each switching branch with a common node coupled to the at least two gateway switches of such switching branch; and
(c) in a first mode of operation, programmatically selectively isolating at least one switching branch independently of any other switching branch through a programmable shunt circuit connected to the common node of the at least one isolated switching branch.

11. The method of claim 10, further including, in a second mode of operation, selectively configuring the shunt circuit of at least one switching branch to not isolate such switching branch when such switching branch is inactive.

12. The method of claim 10, wherein the shunt circuit of a first switching branch includes a corresponding first signal port, and the shunt circuit of a second switching branch includes a corresponding second signal port, and further including, in at least one mode of operation, programmatically setting the shunt circuit of the first switching branch to couple the first signal port to a first external circuit element through one of the at least two gateway switches of the first switching branch, while programmatically setting the shunt circuit of the second switching branch to concurrently couple the second signal port to a second external circuit element through one of the at least two gateway switches of the second switching branch.

13. A method for operating a switch circuit, including:
(a) providing a plurality of gateway switches each configured to be connected to respective external circuit elements;
(b) providing at least one common node, each coupled to at least some of the plurality of gateway switches;
(c) providing a plurality of signal ports; and
(d) providing a plurality of shunt circuits, each connected between at least one common node and a corresponding one of the plurality of signal ports, and each programmatically settable to selectively isolate such corresponding signal port independently of any other signal port.

14. A method for operating a switchable branch circuit including:
(a) providing at least two gateway switches configured to be connected to respective external circuit elements;
(b) providing a common port node connected to the at least two gateway switches; and
(c) providing a shunt circuit connected to the common port node;
wherein, within the switchable branch circuit:
(1) in an inactive mode, programmatically setting the shunt circuit to a closed state and programmatically setting the at least two gateway switches to an open state so as to isolate the common port node from the external circuit elements and to shunt the common port node to circuit ground in order to isolate the common port node with respect to any external circuit elements connected to the gateway switches, and
(2) in an active mode, programmatically setting the shunt circuit to an open state and programmatically setting at least one gateway switch to a closed state so as to enable coupling of the common port node through such at least one closed state gateway switch to the respective external circuit elements connected to such at least one closed state gateway switch.

15. The method of claim 10, 13, or 14, wherein at least one switch includes a stack of series connected FETs.

16. The method of claim 10, 13, or 14, further including fabricating the circuit as an integrated circuit using a silicon-on-insulator fabrication process.

17. The method of claim 10, 13, or 14, wherein at least one switch includes a variable impedance FET programmatically settable to an impedance between the impedance presented by the FET when in a fully open state or when in a fully closed state.

18. The method of claim 10, 13, or 14, wherein at least one external circuit element includes an antenna.

* * * * *